(12) United States Patent
Jung et al.

(10) Patent No.: US 12,243,479 B2
(45) Date of Patent: Mar. 4, 2025

(54) PIXEL CIRCUIT AND DISPLAY PANEL INCLUDING THE SAME

(71) Applicant: LG Display Co., Ltd., Seoul (KR)

(72) Inventors: Jin Woo Jung, Paju-si (KR); Sang Jin Nam, Paju-si (KR); Hyun Suk Lee, Paju-si (KR); Seung Jin Yoo, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 388 days.

(21) Appl. No.: 17/869,621

(22) Filed: Jul. 20, 2022

(65) Prior Publication Data

US 2023/0033778 A1 Feb. 2, 2023

(30) Foreign Application Priority Data

Jul. 30, 2021 (KR) .................. 10-2021-0100602

(51) Int. Cl.
*G09G 3/3233* (2016.01)
*H01L 29/786* (2006.01)

(52) U.S. Cl.
CPC ....... *G09G 3/3233* (2013.01); *H01L 29/7869* (2013.01); *H01L 29/78696* (2013.01); *G09G 2300/0819* (2013.01); *G09G 2300/0842* (2013.01); *G09G 2300/0861* (2013.01); *G09G 2310/08* (2013.01); *G09G 2320/045* (2013.01)

(58) Field of Classification Search
CPC ......... G09G 3/3233; G09G 2300/0819; G09G 2300/0842; G09G 2300/0861; G09G 2310/08; G09G 2320/045
See application file for complete search history.

(56) References Cited

U.S. PATENT DOCUMENTS

| 7,542,019 | B2 | 6/2009 | Park et al. |
| 10,475,386 | B2 | 11/2019 | Kim |
| 10,679,556 | B2 | 6/2020 | Yang et al. |
| 11,100,846 | B2 | 8/2021 | Xuan et al. |

(Continued)

FOREIGN PATENT DOCUMENTS

| CN | 108877664 A | 11/2018 |
| CN | 109559679 A | 4/2019 |

(Continued)

OTHER PUBLICATIONS

Taiwan Intellectual Property Office, Office Action, Taiwanese Patent Application No. 111128635, Jun. 2, 2023, 11 pages.

(Continued)

*Primary Examiner* — Kevin M Nguyen
(74) *Attorney, Agent, or Firm* — Fenwick & West LLP

(57) ABSTRACT

A pixel circuit and a display panel including the same are disclosed according to embodiments. The pixel circuit according to embodiments includes a first pixel circuit including a first EM transistor to which a pulse of a first EM signal is applied, and a first driving transistor for driving a first light emitting element; and a second pixel circuit including a second EM transistor to which a pulse of a second EM signal is applied, and a second driving transistor for driving a second light emitting element. A node between the first EM transistor and the first driving transistor and a node between the second EM transistor and the second driving transistor are connected.

13 Claims, 20 Drawing Sheets

(56) References Cited

U.S. PATENT DOCUMENTS

| | | | |
|---|---|---|---|
| 11,910,647 B2 * | 2/2024 | Park | G09G 3/3233 |
| 2003/0103022 A1 | 6/2003 | Noguchi et al. | |
| 2006/0125807 A1 | 6/2006 | Park et al. | |
| 2014/0009456 A1 | 1/2014 | Kim et al. | |
| 2014/0300281 A1 | 10/2014 | Chaji | |
| 2015/0015468 A1 | 1/2015 | Ko et al. | |
| 2015/0145848 A1 | 5/2015 | Rohatgi | |
| 2016/0148565 A1 | 5/2016 | Wang | |
| 2017/0018223 A1 | 1/2017 | Li et al. | |
| 2017/0032736 A1 | 2/2017 | Gu et al. | |
| 2017/0076646 A1 | 3/2017 | Gu et al. | |
| 2019/0005883 A1 | 1/2019 | Kim | |
| 2019/0325823 A1 | 10/2019 | Yang et al. | |
| 2020/0258447 A1 | 8/2020 | Chang et al. | |
| 2021/0217352 A1 | 7/2021 | Xuan et al. | |

FOREIGN PATENT DOCUMENTS

| | | |
|---|---|---|
| CN | 110226195 A | 9/2019 |
| JP | 2006-146153 A | 6/2006 |
| JP | 2019-012256 A | 1/2019 |
| KR | 10-2015-0002324 A | 1/2015 |
| KR | 10-2015-0061898 A | 6/2015 |
| KR | 10-2019-0138470 A | 12/2019 |
| KR | 10-2020-0082830 A | 7/2020 |
| KR | 10-2172393 B1 | 10/2020 |

OTHER PUBLICATIONS

The Japan Patent Office, Office Action, Japanese Patent Application No. 2022-117641, Aug. 29, 2023, 11 pages.

European Patent Office, Extended European Search Report and Opinion, EP Patent Application No. 22186929.0, Dec. 15, 2022, nine pages.

China National Intellectual Property Administration, Office Action, Chinese Patent Application No. 202210723516.3, Dec. 20, 2024, 14 pages.

* cited by examiner

PIXEL CIRCUIT AND DISPLAY PANEL INCLUDING THE SAME

CROSS-REFERENCE TO RELATED APPLICATION

This application claims priority to and the benefit of Republic of Korea Patent Application No. 10-2021-0100602, filed Jul. 30, 2021, the disclosure of which is hereby incorporated by reference in its entirety.

BACKGROUND

1. Field

The present disclosure relates to a pixel circuit and a display panel including the same.

2. Discussion of Related Art

Display devices includes a liquid crystal display (LCD) device, an electroluminescence display device, a field emission display (FED) device, a plasma display panel (PDP), and the like.

Electroluminescent display devices are divided into inorganic light emitting display devices and organic light emitting display devices according to a material of a light emitting layer. An active-matrix type organic light emitting display device reproduces an input image using a self-emissive element which emits light by itself, for example, an organic light emitting diode (hereinafter referred to as an "OLED"). An organic light emitting display device has advantages in that a response speed is fast and luminous efficiency, luminance, and a viewing angle are large.

Some of display devices, for example, a liquid crystal display device or an organic light emitting display device includes a display panel including a plurality of sub-pixels, a driver outputting a driving signal for driving the display panel, a power supply generating power to be supplied to the display panel or the driver, and the like. The driver includes a gate driver that supplies a scan signal or a gate signal to the display panel, and a data driver that supplies a data signal to the display panel.

In such a display device, when a driving signal such as a scan signal, a light emission control (EM) signal, and a data signal is supplied to a plurality of sub-pixels formed in the display panel, the selected sub-pixel transmits light or emits light directly to thereby display an image.

An EM transistor to which an EM signal is applied in a sub-pixel can be duty-driven, and is continuously driven to maintain luminance based on one frame relatively compared to a scan transistor and a sensing transistor. Therefore, the EM transistor has low reliability when driving at 100% duty cycle.

SUMMARY

The present disclosure is directed to solving all the above-described necessity and problems.

The present disclosure provides a pixel circuit capable of ensuring reliability of an EM transistor and a display panel including the same.

It should be noted that objects of the present disclosure are not limited to the above-described objects, and other objects of the present disclosure will be apparent to those skilled in the art from the following descriptions.

A pixel circuit according to the present disclosure includes a first pixel circuit including a first EM transistor to which a pulse of a first EM signal is applied, and a first driving transistor for driving a first light emitting element; and a second pixel circuit including a second EM transistor to which a pulse of a second EM signal is applied, and a second driving transistor for driving a second light emitting element, and a node between the first EM transistor and the first driving transistor and a node between the second EM transistor and the second driving transistor are connected.

A display panel according to the present disclosure includes a plurality of pixel circuits each including a light emitting element that emits light by a current flowing through a current path formed between a high-potential voltage line and a low-potential voltage line, and an EM transistor for switching the current path in response to an EM signal, and the current path is connected between at least two pixel circuits.

According to the present disclosure, source nodes of EM elements between adjacent pixels sharing a data line are connected to drive a plurality of light emitting elements with one EM device, thereby reducing the duty ratio of driving the EM elements, reducing stress, and ensuring reliability.

According to the present disclosure, the driving ratio of the EM transistor can be lowered without adding an EM line and an EM signal.

The effects of the present disclosure are not limited to the above-mentioned effects, and other effects that are not mentioned will be apparently understood by those skilled in the art from the following description and the appended claims.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which.

DETAILED DESCRIPTION

Figure 1:
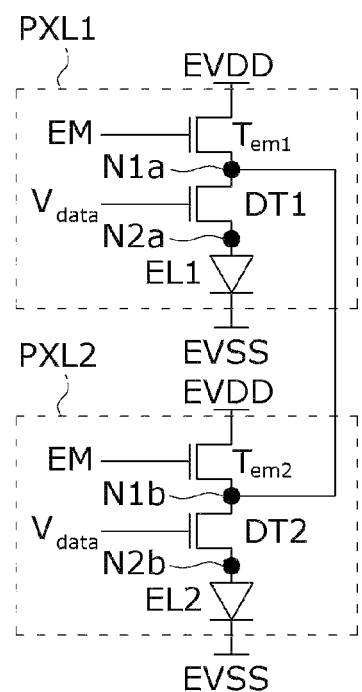
FIG. 1 is a diagram illustrating a pixel circuit according to a first embodiment of the present disclosure.

The advantages and features of the present disclosure and methods for accomplishing the same will be more clearly understood from embodiments described below with reference to the accompanying drawings. However, the present disclosure is not limited to the following embodiments but may be implemented in various different forms. Rather, the present embodiments will make the disclosure of the present disclosure complete and allow those skilled in the art to completely comprehend the scope of the present disclosure. The present disclosure is only defined within the scope of the accompanying claims.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the present specification. Further, in describing the present disclosure, detailed descriptions of known related technologies may be omitted to avoid unnecessarily obscuring the subject matter of the present disclosure.

The terms such as "comprising," "including," and "having" used herein are generally intended to allow other components to be added unless the terms are used with the term "only." Any references to singular may include plural unless expressly stated otherwise.

Components are interpreted to include an ordinary error range even if not expressly stated.

When the position relation between two components is described using the terms such as "on," "above," "below," and "next," one or more components may be positioned between the two components unless the terms are used with the term "immediately" or "directly."

The terms "first," "second," and the like may be used to distinguish components from each other, but the functions or structures of the components are not limited by ordinal numbers or component names in front of the components.

The same reference numerals may refer to substantially the same elements throughout the present disclosure.

The following embodiments can be partially or entirely bonded to or combined with each other and can be linked and operated in technically various ways. The embodiments can be carried out independently of or in association with each other.

Hereinafter, various embodiments of the present disclosure will be described in detail with reference to the accompanying drawings.

Figure 2A:
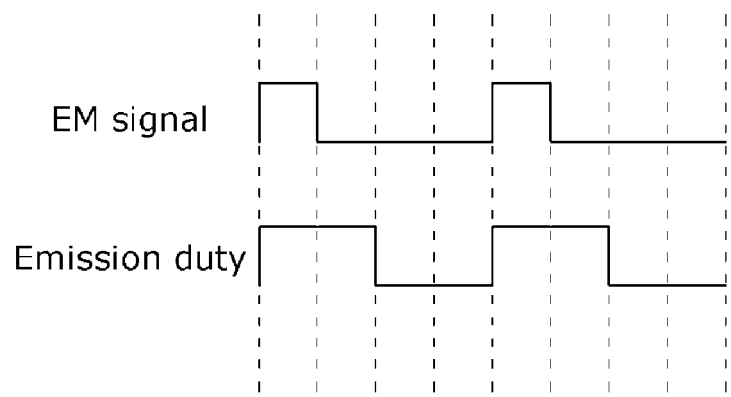
FIGS. 2A and 2B are diagrams illustrating an operation principle of the pixel circuit shown in FIG. 1 according to the first embodiment of the present disclosure.
Figure 2B:
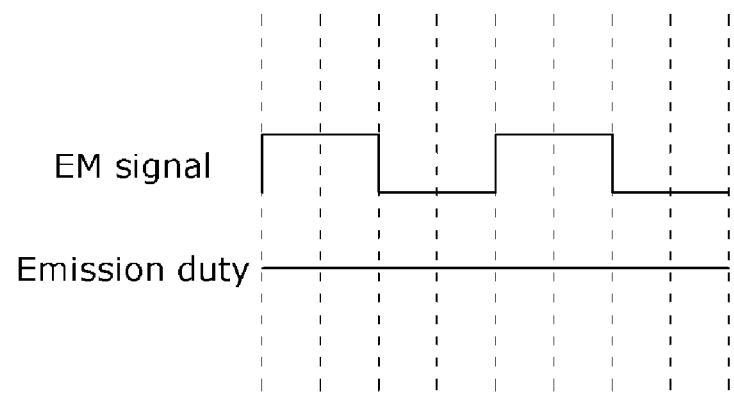

FIG. 1 is a diagram illustrating a pixel circuit according to a first embodiment of the present disclosure, and FIGS. 2A and 2B are diagrams illustrating an operation principle of the pixel circuit shown in FIG. 1 according to the first embodiment.

Referring to FIG. 1, the pixel circuit according to an embodiment includes a first pixel circuit PXL1 and a second pixel circuit PXL2 arranged in a column direction. Each of the first pixel circuit PXL1 and the second pixel circuit PXL2 includes a light emitting element EL, a driving transistor DT for driving the light emitting element EL, and an EM transistor Tem for switching a current path connected to the driving transistor DT. The driving transistor DT and the EM transistor Tem may be implemented as n-channel oxide transistors in one embodiment.

The first pixel circuit PXL1 includes a first light emitting element EL1, a first driving transistor DT1, and a first EM transistor Tem1. The first EM transistor Tem1 is connected between a first power line and a first-a node N1a, the first driving transistor DT1 is connected between the first-a node N1a and a second-a node N2a, and the first light emitting element EL1 is connected between the second-a node N2a and a low-potential voltage line.

When a gate-on voltage of an EM signal is applied, the first EM transistor Tem1 is turned on and supplies a pixel driving voltage EVDD to the first-a node N1a. The first EM transistor Tem1 includes a gate connected to a gate line to which the EM signal is applied, a first electrode connected to the first power line to which the pixel driving voltage is supplied, and a second electrode connected to the first-a node N1a.

The first driving transistor DT1 drives the first light emitting element EL1 by supplying a current to the first light emitting element EL1 according to a gate-source voltage Vgs. The first driving transistor DT1 includes a gate (or gate electrode) to which a data voltage is applied, a first electrode (or drain electrode) connected to the first-a node N1a, and a second electrode (or source electrode) connected to the second-a node N2a.

The second pixel circuit PXL2 includes a second light emitting element EL2, a second driving transistor DT2, and a second EM transistor Tem2. The second EM transistor Tem2 is connected between the first power line and a first-b node N1b, the second driving transistor DT2 is connected between the first-b node N1b and a second-b node N2b, and the second light emitting element EL2 is connected between the second-b node N2b and a second power line.

When the gate-on voltage of the EM signal is applied, the second EM transistor Tem2 is turned on and supplies the pixel driving voltage EVDD to the first-b node N1b. The second EM transistor Tem2 includes a gate connected to the gate line to which the EM signal is applied, a first electrode connected to the first power line to which the pixel driving voltage is supplied, and a second electrode connected to the first-b node N1b.

The second driving transistor DT2 drives the second light emitting element EL2 by supplying a current to the second light emitting element EL2 according to the gate-source voltage Vgs. The second driving transistor DT2 includes a gate to which the data voltage is applied, a first electrode connected to the first-b node N1b, and a second electrode connected to the second-b node N2b.

In this case, the first-a node N1a in the first pixel circuit PXL1 and the first-b node N1b in the second pixel circuit PXL2 are connected to each other. The first-a node N1a and the first-b node N1b are one first node N1 connected by a connection line. When the gate-on voltage of the EM signal is applied to the first EM transistor Tem1, the first EM transistor Tem1 is turned on and supplies the pixel driving voltage to the first-a node N1a and the first-b node N1b. The first driving transistor DT1 connected to the first-a node N1a and the second driving transistor DT2 connected to the first-b node N1b supply a current to the first light emitting element EL1 and the second light emitting element EL2 according to the gate-source voltage and thereby drive the first light emitting element EL1 and the second light emitting element EL2.

In addition, when the gate-on voltage of the EM signal is applied to the second EM transistor Tem2, the second EM transistor Tem2 is turned on and supplies the pixel driving voltage to the first-b node N1b and the first-a node N1a. The second driving transistor DT2 connected to the first-b node N1b and the first driving transistor DT1 connected to the first-a node N1a supply a current to the second light emitting element EL2 and the first light emitting element EL1 according to the gate-source voltage and thereby drive the second light emitting element EL2 and the first light emitting element EL1.

Referring to FIGS. 2A and 2B, in case that the first pixel circuit PXL1 and the second pixel circuit PXL2 are connected, when the first EM transistor Tem1 is turned on, the pixel driving voltage is applied and thus both the first and second light emitting elements EL1 and EL2 are driven, and when the second EM transistor Tem2 is turned on, the pixel driving voltage is applied and thus both the first and second light emitting elements EL1 and EL2 are driven.

In this case, a light emission duty ratio of the first and second light emitting elements EL1 and EL2 is different from a duty ratio of the EM signal applied to the first and second EM transistors Tem1 and Tem2. In an embodiment, the light emission duty ratio is greater than the duty ratio of the EM signal. Here, the light emission duty ratio refers to the ratio of a light emission section during which light is emitted in one cycle including the light emission section and a non-light emission section during which light is not emitted. The duty ratio of the EM signal refers to the ratio of an on-section in one cycle including the on-section and an off-section.

For example, as shown in FIG. 2A, when the duty ratio of the EM signal is 25%, the light emission duty ratio may be 50% in one embodiment. As shown in FIG. 2B, when the duty ratio of the EM signal is 50%, the light emission duty ratio may be 100% in one embodiment.

The duty ratio of the EM signal is a value of (light emission duty ratio/number of pixel circuits). According to an embodiment, when two pixel circuits are connected, the duty ratio of the EM signal is half of the light emission duty ratio. Therefore, the number of times the switch element is driven is reduced, thereby reducing stress.

Figure 3:
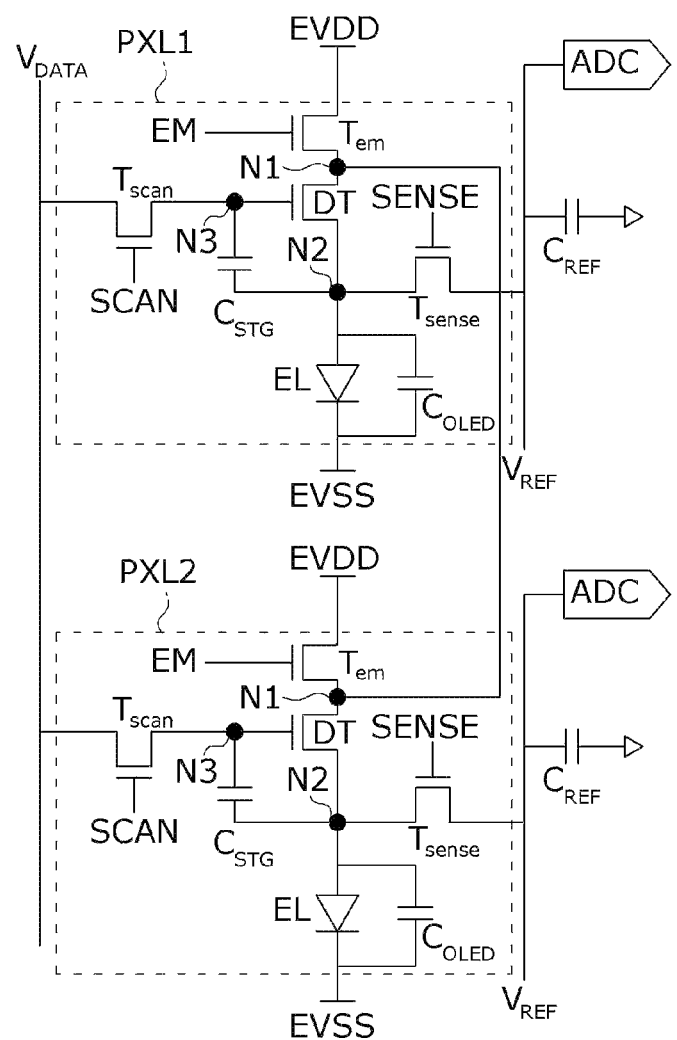
FIGS. 3 and 4 are circuit diagrams illustrating pixel circuits according to a second embodiment and a third embodiments of the present disclosure, respectively.
Figure 4:
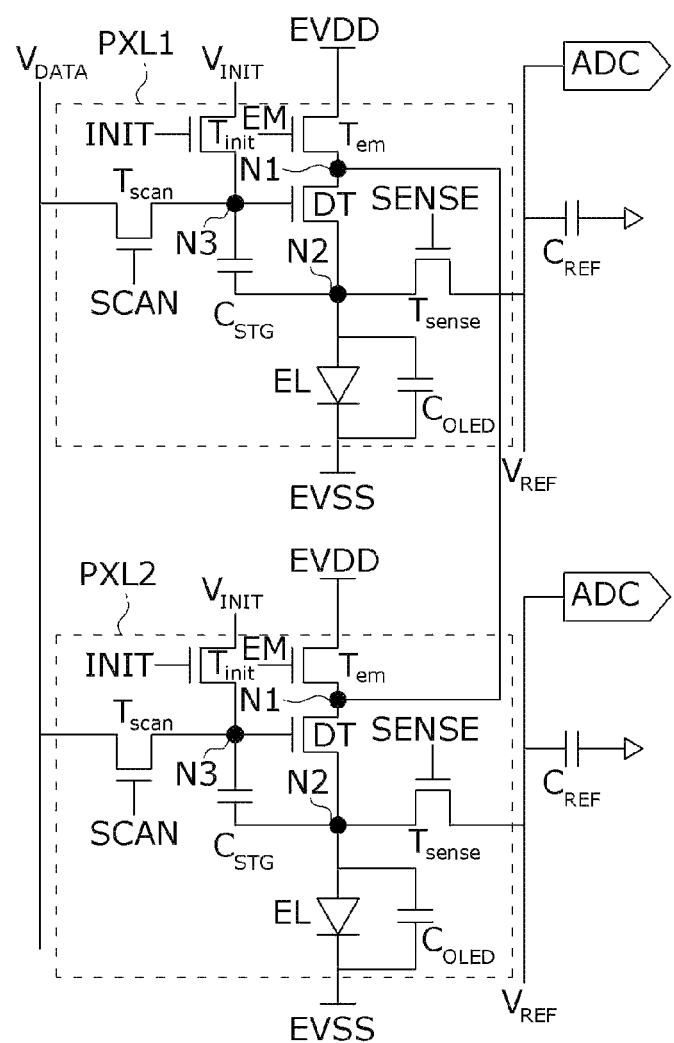

FIGS. 3 and 4 are circuit diagrams illustrating pixel circuits according to a second embodiment and a third embodiment of the present disclosure, respectively;

Referring to FIG. 3, the pixel circuit according to a second embodiment includes a first pixel circuit PLX1 and a second pixel circuit PLX2 arranged in a column direction and sharing a data line. Each of the first pixel circuit PLX1 and the second pixel circuit PLX1 includes a light emitting element EL, a driving transistor DT for driving the light emitting element EL, an EM transistor Tem for switching a current path connected to the driving transistor DT, a sensing transistor Tsense, a scan transistor Tscan, and a capacitor $C_{STG}$ for storing a gate-source voltage Vgs of the driving transistor DT. The driving transistor DT, the EM transistor Tem, the sensing transistor Tsense, and the scan transistor Tscan may be implemented as n-channel oxide transistors.

The light emitting element EL emits light by a current applied through a channel of the driving element DT according to a gate-source voltage Vgs of the driving element DT that varies according to a data voltage Vdata. The light emitting element EL may be implemented as an OLED including an organic compound layer formed between an anode and a cathode. The organic compound layer may include, but is not limited to, a hole injection layer (HIL), a hole transport layer (HTL), a light emitting layer (EML), an electron transport layer (ETL), and an electron injection layer (EIL). The anode of the light emitting element EL is connected to the driving element DT through a second node n2, and the cathode of the light emitting element EL is connected to a second power line 42 to which a low-potential power voltage EVSS is applied.

An organic light emitting diode used as the light emitting element may have a tandem structure in which a plurality of light emitting layers are stacked. The organic light emitting diode having the tandem structure may improve the luminance and lifespan of the pixel.

The scan transistor Tscan is turned on according to a gate-on voltage VGH of a scan signal SCAN, connects the data line to a third node N3, and supplies a data voltage Vdata to the driving transistor DT connected to the third node N3. The third node N3 is connected to a gate of the driving transistor DT. Therefore, a gate voltage of the driving transistor DT is equal to a voltage of the third node N3. The scan transistor Tscan includes a gate connected to a first gate line to which the scan signal SCAN is applied, a first electrode connected to the data line, and a second electrode connected to the third node N3.

The sensing transistor Tsense is turned on according to a gate-on voltage VGH of a sensing signal SENSE and supplies a reference voltage Vref to a second node N2. The sensing transistor Tsense includes a gate connected to the first gate line to which the sensing signal SENSE is applied, a first electrode connected to a reference voltage line to which the reference voltage Vref is applied, and a second electrode connected to the second node N2.

The EM transistor Tem is turned on according to a gate-on voltage VEH of an EM signal EM and supplies a pixel driving voltage EVDD to a first node N1. The EM transistor Tem includes a gate connected to an EM line to which the EM signal EM is applied, a first electrode connected to a first power line to which the pixel driving voltage EVDD is supplied, and a second electrode connected to the first node N1.

Source nodes of third switch elements in the first and second pixel circuits PLX1 and PLX2 are connected to each other. That is, the first nodes N1 of the first and second pixel circuits PLX1 and PLX2 are connected to each other.

The driving transistor DT drives the light emitting element EL by supplying a current to the light emitting element EL according to the gate-source voltage Vgs. The driving transistor DT includes a gate connected to the third node N3, a first electrode (or drain) connected to the first node N1, and a second electrode (or source) connected to an anode of the light emitting element EL through the second node N2.

The storage capacitor $C_{STG}$ is connected between the third node N3 and the second node N2. The storage capacitor $C_{STG}$ charges the gate-source voltage Vgs of the driving transistor DT.

In a sensing mode, a current flowing through a channel of the driving transistor DT or a voltage between the driving transistor DT and the light emitting element EL is sensed through the reference voltage line. A current flowing through the reference voltage line is converted into a voltage through an integrator and converted into digital data through an analog-to-digital converter (ADC). This digital data is sensing data including a threshold voltage or mobility information of the driving transistor DT. The sensing data is transmitted to a data operation unit. The data operation unit may receive the sensing data from the ADC and compensate for driving deviation and deterioration of pixels by adding or multiplying a compensation value selected based on the sensing data to pixel data.

Referring to FIG. 4, the pixel circuit according to a third embodiment includes a first pixel circuit PLX1 and a second pixel circuit PLX2 arranged in a column direction and sharing a data line. Each of the first pixel circuit PLX1 and the second pixel circuit PLX2 further includes an initialization transistor Tinit connected between an initialization voltage line and the third node N3 in addition to the configuration of the second embodiment. In this pixel circuit, the driving transistor DT, the EM transistor Tem, the sensing transistor Tsense, the scan transistor Tscan, and the initialization transistor Tinit may be implemented as n-channel oxide transistors.

The initialization transistor Tinit applies an initialization voltage $V_{INIT}$ in response to an initialization signal INIT. In this case, the initialization voltage $V_{INIT}$ is applied to the third node N3 through the initialization voltage line.

Figure 5:
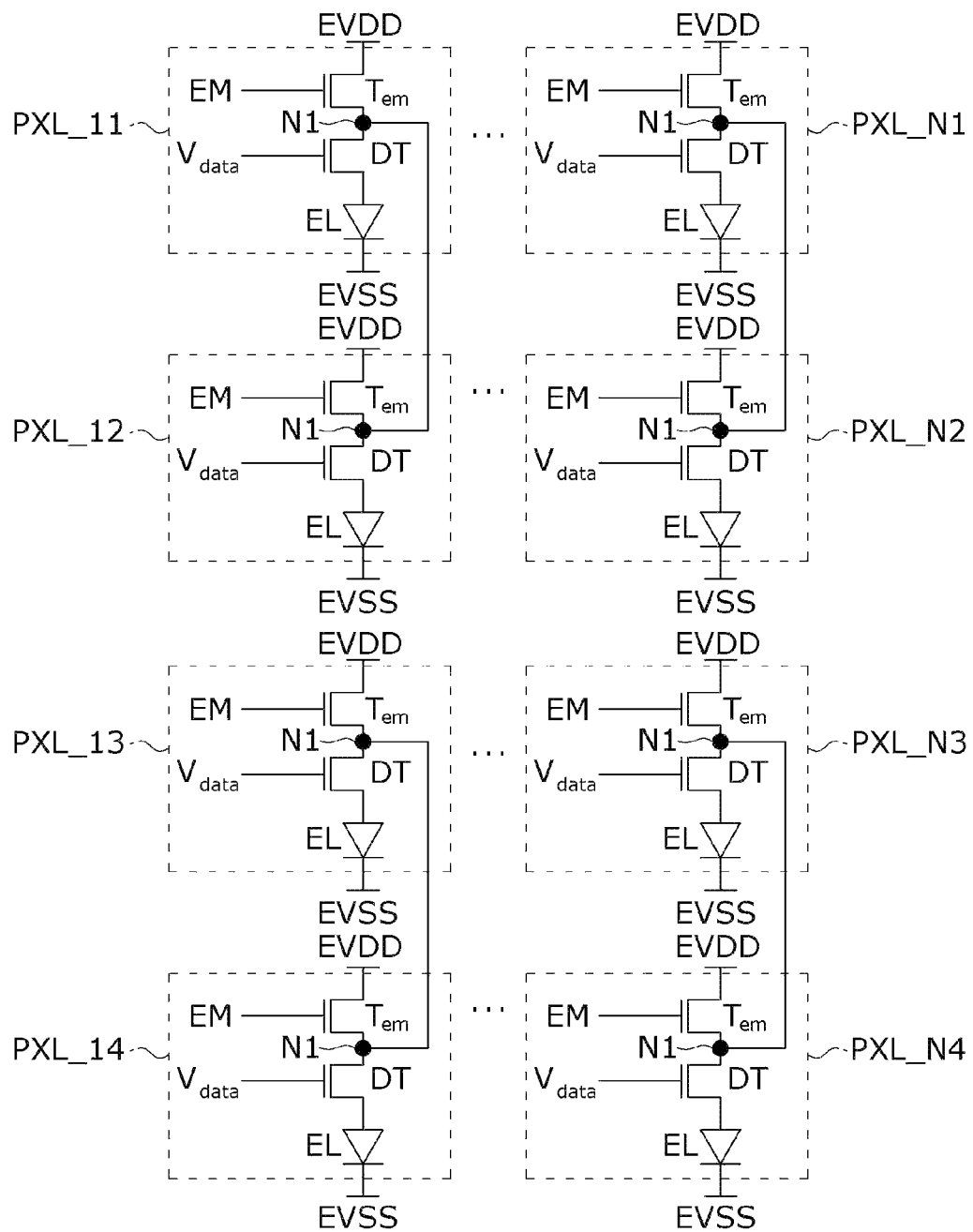
FIG. 5 is a diagram illustrating a connection state of a pixel circuit in a display panel according to one embodiment of the present disclosure.
Figure 6:
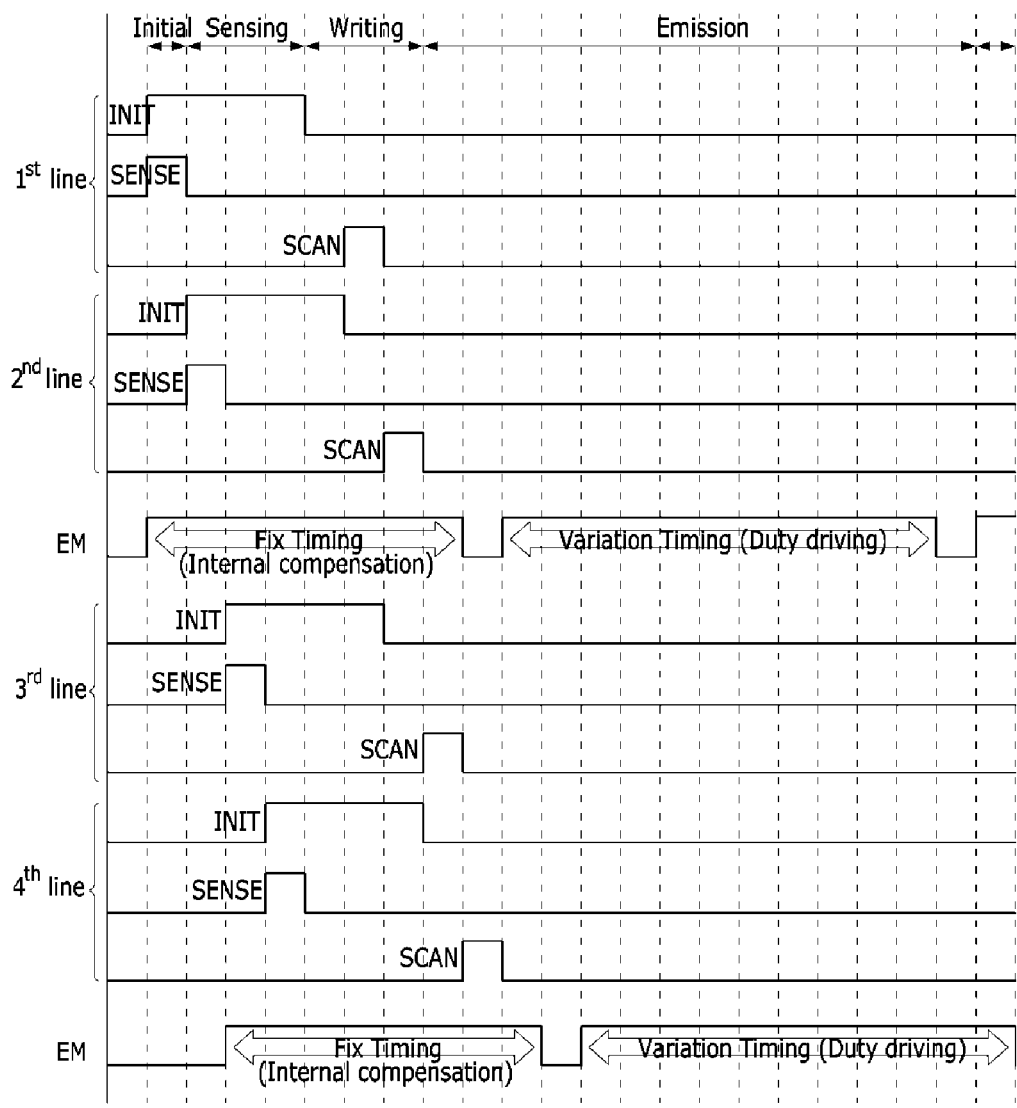
FIG. 6 is a diagram illustrating driving timing of the pixel circuit shown in FIG. 5 according to one embodiment of the present disclosure.
Figure 7A:
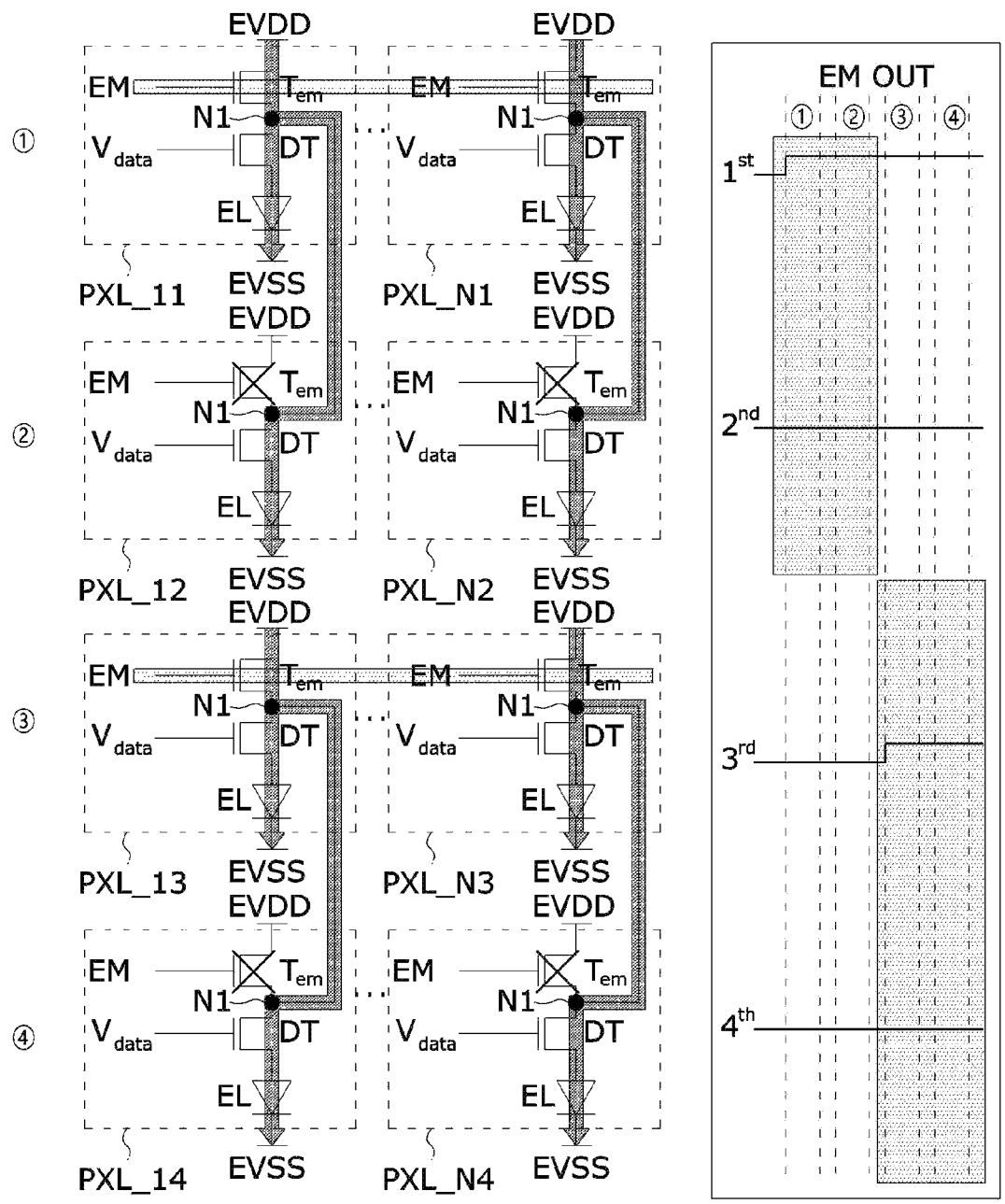
FIGS. 7A and 7B are diagrams illustrating an operation principle of the pixel circuit shown in FIG. 5 according to one embodiment of the present disclosure.
Figure 7B:
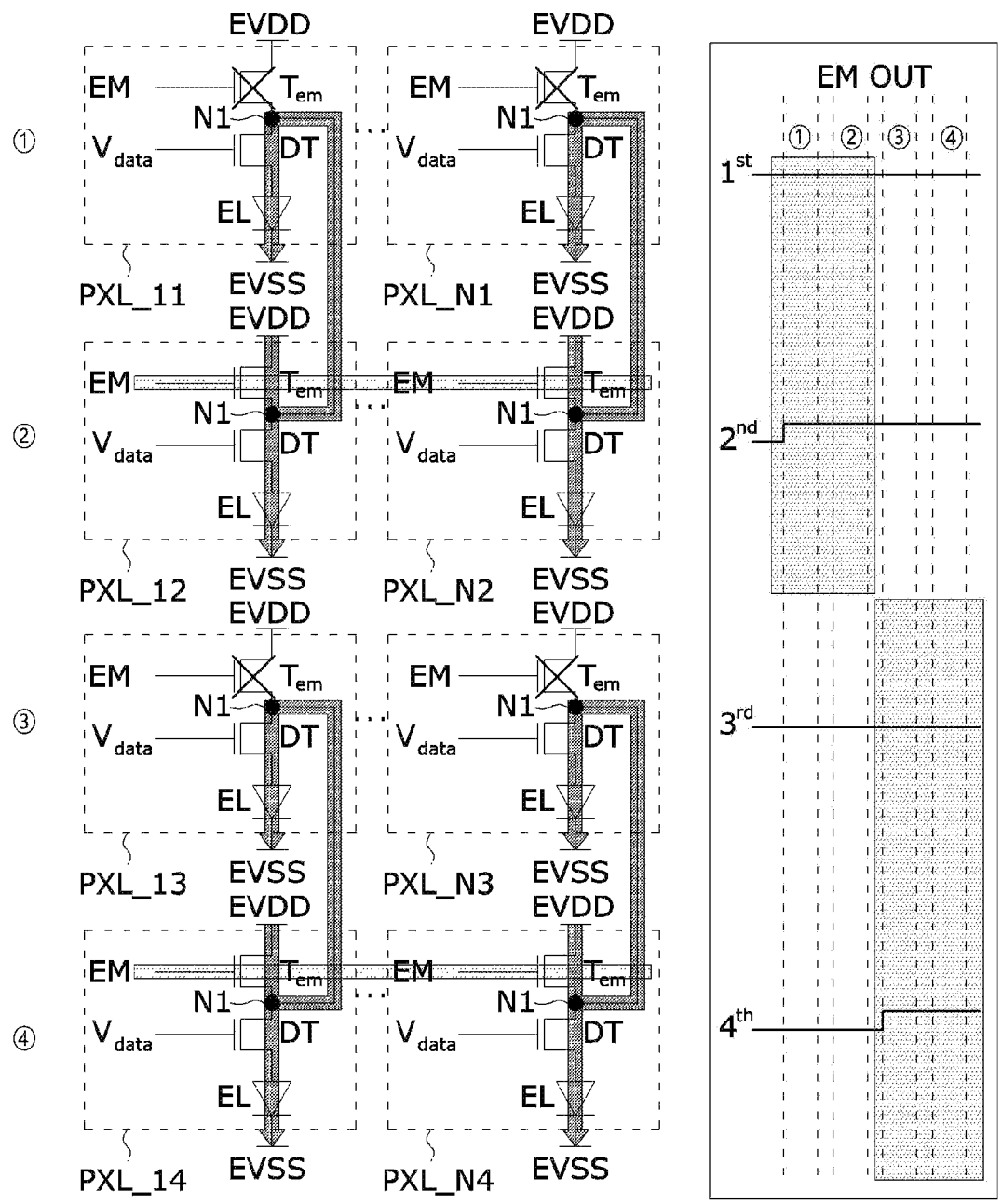

FIG. 5 is a diagram illustrating a connection state of a pixel circuit in a display panel according to one embodiment, FIG. 6 is a diagram illustrating driving timing of the pixel circuit shown in FIG. 5 according to one embodiment, and FIGS. 7A and 7B are diagrams illustrating an operation principle of the pixel circuit shown in FIG. 5 according to one embodiment.

Referring to FIGS. 5 and 6, the display panel includes a plurality of pixel circuits PXLs sharing a data line. The plurality of pixel circuits PXLs are connected in parallel two by two (e.g., in pairs). That is, source nodes of EM elements between two adjacent pixel circuits are connected, so that the two pixel circuits are connected in parallel.

In this case, the EM signal may be driven by distinguishing a section for internal compensation and a section for duty driving. The EM signal is alternately applied for each frame, but the driving timing is the same.

Referring to FIG. 7A, the gate-on voltage of the EM signal is applied to odd-numbered EM lines in a first frame period, and the EM transistors Tem in the first pixel circuits PXL_11, . . . , and PXL_N1 connected to the first EM line and the third pixel circuits PXL_13, . . . , and PXL_N3 connected to the third EM line are turned on. That is, when the EM transistors Tem in the first pixel circuits PXL_11, . . . , and PXL_N1 are turned on, the pixel driving voltage is applied to drive the light emitting elements of the first pixel circuits PXL_11, . . . , and PXL_N1 and the second pixel circuits PXL_12, . . . , and PXL_N2. When the EM transistors Tem in the third pixel circuits PXL_13, . . . , and PXL_N3 are turned on, the pixel driving voltage is applied to drive the light emitting elements of the third pixel circuits PXL_13, . . . , and PXL_N3 and the fourth pixel circuits PXL_14, . . . , and PXL_N4.

Referring to FIG. 7B, the gate-on voltage of the EM signal is applied to even-numbered EM lines in a second frame period, and the EM transistors Tem in the second pixel circuits PXL_12, . . . , and PXL_N2 connected to the second EM line and the fourth pixel circuits PXL_14, . . . , and PXL_N4 connected to the fourth EM line are turned on. That is, when the EM transistors Tem in the second pixel circuits PXL_12, . . . , and PXL_N2 are turned on, the pixel driving voltage is applied to drive the light emitting elements of the second pixel circuits PXL_12, . . . , and PXL_N2 and the first pixel circuits PXL_11, . . . , and PXL_N1. When the EM transistors Tem in the fourth pixel circuits PXL_14, . . . , and PXL_N4 are turned on, the pixel driving voltage is applied to drive the light emitting elements of the fourth pixel circuits PXL_14, . . . , and PXL_N4 and the third pixel circuits PXL_13, . . . , and PXL_N3.

In a state where the light emitting element is driven at a 100% duty ratio, the EM transistor is driven at a 50% duty ratio. In this case, the EM transistors share the EM signal in units of 2 horizontal periods (2H).

As such, in the odd-numbered frame period, the EM elements in the odd-numbered pixel circuits are turned on to drive the light emitting elements in the parallel-connected pixel circuits, and in the even-numbered frame period, the EM elements in the even-numbered pixel circuits are turned on to drive the light emitting elements in the parallel-connected pixel circuits. Accordingly, it is possible to drive all the light emitting elements by alternately driving two EM elements.

Figure 8:
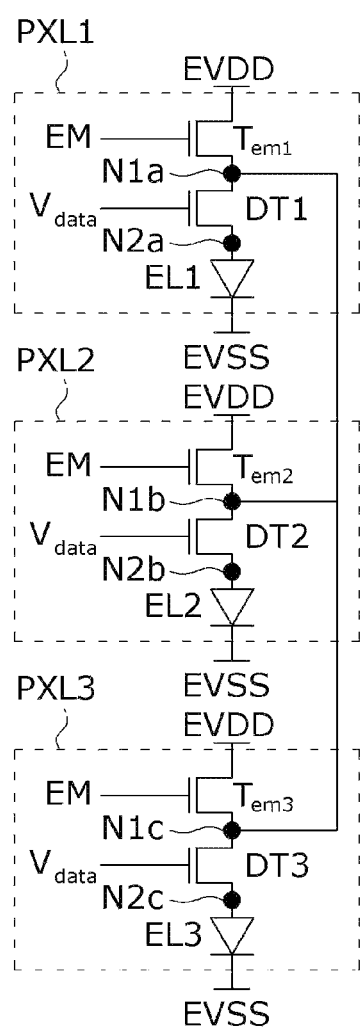
FIG. 8 is a diagram illustrating a pixel circuit according to a fourth embodiment of the present disclosure.
Figure 9A:
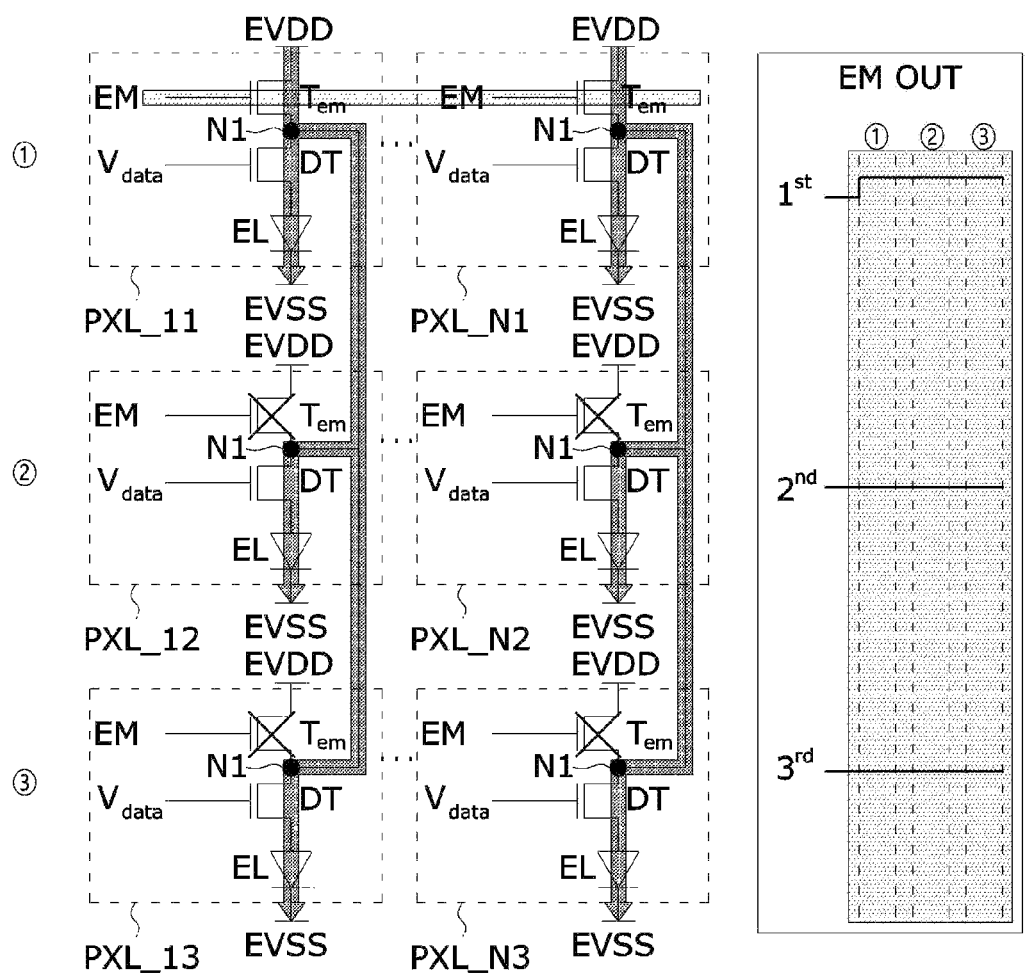
FIGS. 9A to 9C are diagrams illustrating an operation principle of the pixel circuit shown in FIG. 8 according to the fourth embodiment of the present disclosure.
Figure 9B:
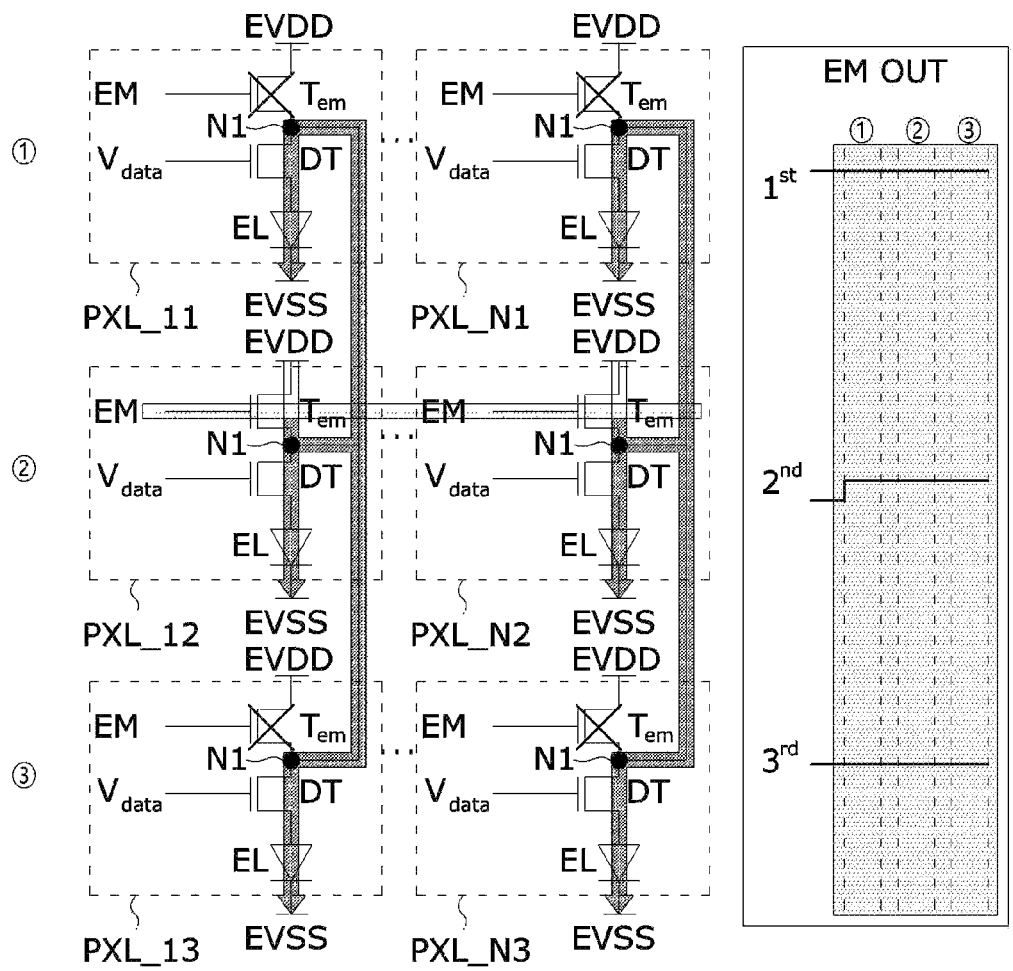
Figure 9C:
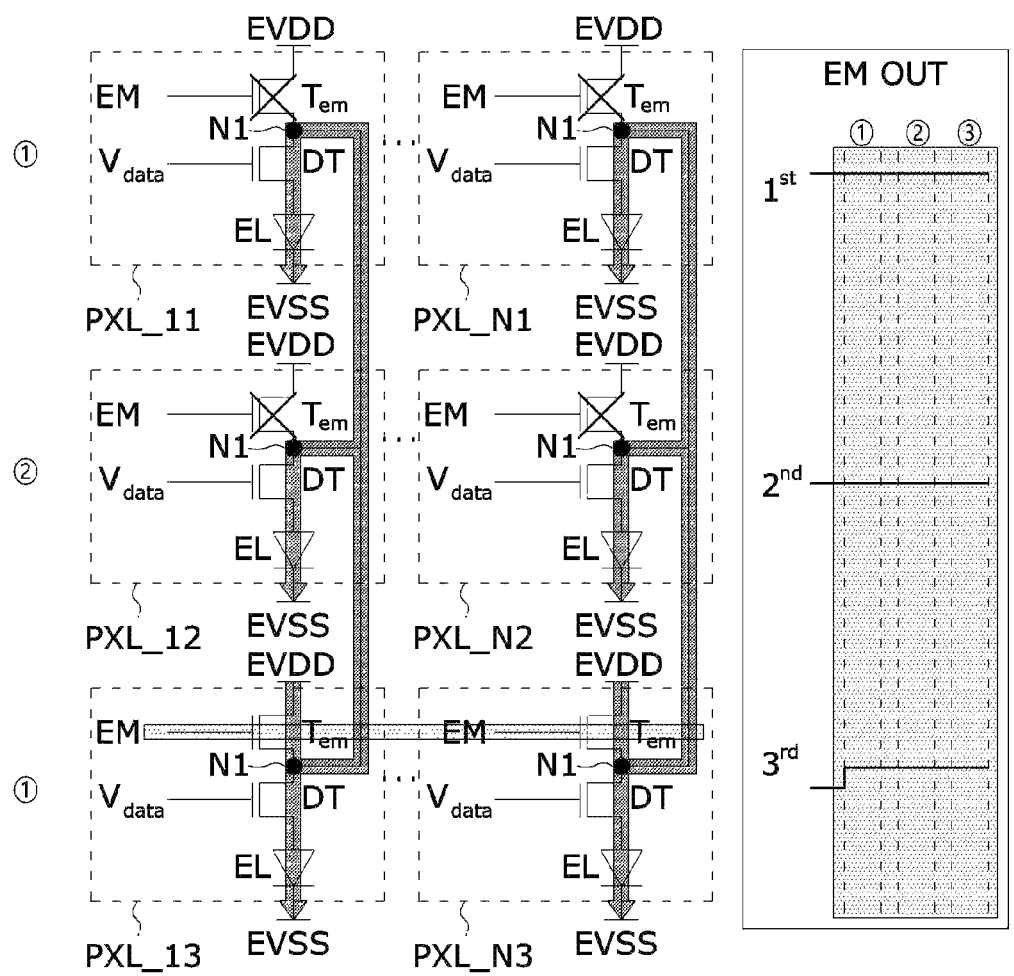

FIG. 8 is a diagram illustrating a pixel circuit according to a fourth embodiment of the present disclosure, and FIGS. 9A to 9C are diagrams illustrating an operation principle of the pixel circuit shown in FIG. 8 according to the fourth embodiment.

Referring to FIG. 8, the pixel circuit according to the fourth embodiment includes a first pixel circuit PXL1, a second pixel circuit PXL2, and a third pixel circuit PXL3 arranged in a column direction. Each of the first pixel circuit PXL1, the second pixel circuit PXL2, and a third pixel circuit PXL3 includes a light emitting element EL, a driving transistor DT for driving the light emitting element EL, and an EM transistor Tem for switching a current path connected to the driving transistor DT.

In this case, a first-a node N1a in the first pixel circuit PXL1, a first-b node N1b in the second pixel circuit PXL2, and a first-c node N1c in the third pixel circuit PXL3 are connected to each other. The first-a node N1a, the first-b node N1b, and the first-c node N1c are one first node N1 connected by a connection line. When a gate-on voltage of an EM signal is applied to a first EM transistor Tem1 in the first pixel circuit PXL1, a second EM transistor Tem2 in the second pixel circuit PXL2, or a third EM transistor Tem3 in the third pixel circuit PXL3, it is turned on and supplies the pixel driving voltage to the first node N1 of the first, second, and third pixel circuits PXL1, PXL2, and PXL3. The driving transistor DT connected to the first node N1 in the first pixel circuit PXL1, the driving transistor DT connected to the first node N1 in the second pixel circuit PXL2, and the driving transistor DT connected to the first node N1 in the third pixel circuit PXL3 supply a current to the first, second, and third light emitting elements EL1, EL2, and EL3 according to the gate-source voltage and thereby drive the first, second, and third light emitting elements EL1, EL2, and EL3.

In this case, the light emission duty ratio of the first, second, and third light emitting elements EL1, EL2, and EL3 is different from the duty ratio of the EM signal applied to the first, second, and third EM transistors. In an embodiment, the light emission duty ratio is greater than the duty ratio of the EM signal.

Although a case in which two pixel circuits or three pixel circuits are connected is described exemplarily herein, the present disclosure is not limited to that case, and more pixel circuits may be connected. That is, in embodiments, at least two pixel circuits may be connected. As the number of connected pixel circuits increases, the duty ratio of the EM signal may decrease. As the duty ratio of the EM signal decreases, the stress of the switch element also decreases.

Referring to FIG. 9A, the gate-on voltage of the EM signal is applied to the first EM line in the first frame period, and the EM transistors Tem in the first pixel circuits PXL_11, . . . , and PXL_N1 connected to the first EM line are turned on. That is, when the EM transistors Tem in the first pixel circuits PXL_11, . . . , and PXL_N1 are turned on, the pixel driving voltage is applied to drive the light emitting elements EL in the first pixel circuits PXL_11, . . . , and PXL_N1, the second pixel circuits PXL_12, . . . , and PXL_N2, and the third pixel circuits PXL_13, . . . , and PXL_N3.

At this time, the gate-off voltage is applied to the EM transistors Tem in the second pixel circuits PXL_12, . . . , and PXL_N2 and the third pixel circuits PXL_13, . . . , and PXL_N3, which are thereby turned off.

Referring to FIG. 9B, the gate-on voltage of the EM signal is applied to the second EM line in the second frame period, and the EM transistors Tem in the second pixel circuits PXL_12, . . . , and PXL_N2 connected to the second EM line are turned on. That is, when the EM transistors Tem in the second pixel circuits PXL_12, . . . , and PXL_N2 are turned on, the pixel driving voltage is applied to drive the light emitting elements EL in the second pixel circuits PXL_12, . . . , and PXL_N2, the third pixel circuits PXL_13, . . . , and PXL_N3, and the first pixel circuits PXL_11, . . . , and PXL_N1.

At this time, the gate-off voltage is applied to the EM transistors Tem in the first pixel circuits PXL_11, . . . , and PXL_N1 and the third pixel circuits PXL_13, . . . , and PXL_N3, which are thereby turned off.

Referring to FIG. 9C, the gate-on voltage of the EM signal is applied to the third EM line in the third frame period, and the EM transistors Tem in the third pixel circuits PXL_13, . . . , and PXL_N3 connected to the third EM line are turned on. That is, when the EM transistors Tem in the third pixel circuits PXL_13, . . . , and PXL_N3 are turned on, the pixel driving voltage is applied to drive the light emitting elements EL in the third pixel circuits PXL_13, . . . , and PXL_N3, the first pixel circuits PXL_11, . . . , and PXL_N1, and the second pixel circuits PXL_12, . . . , and PXL_N2.

At this time, the gate-off voltage is applied to the EM transistors Tem in the first pixel circuits PXL_11 . . . , and PXL_N1 and the second pixel circuits PXL_12, . . . , and PXL_N2, which are thereby turned off.

In a state where the light emitting element is driven at a 100% duty ratio, the EM transistor is driven at an approximately 33% duty ratio. In this case, the EM transistors share the EM signal in units of 3 horizontal periods (3H).

As such, in case that the three pixel circuits are connected, the EM elements the three pixel circuits are sequentially turned on during each frame period, and the light emitting elements in the three pixel circuits are all driven. Accordingly, it is possible to drive all the light emitting elements by alternately driving three EM elements.

Figure 10:
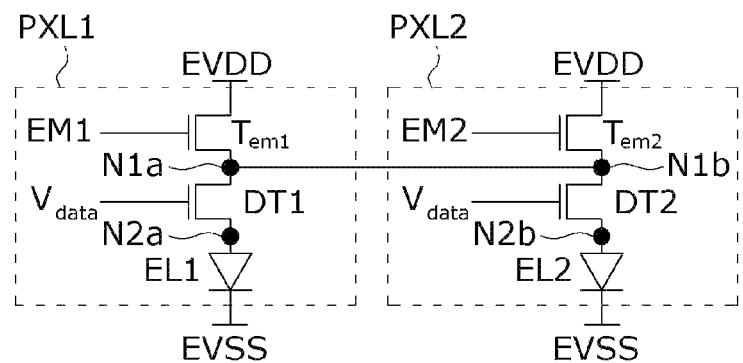
FIG. 10 is a diagram illustrating a pixel circuit according to a fifth embodiment of the present disclosure.

FIG. 10 is a diagram illustrating a pixel circuit according to a fifth embodiment of the present disclosure.

Referring to FIG. 10, the pixel circuit according to the fifth embodiment includes a first pixel circuit PXL1 and a second pixel circuit PXL2 arranged in a line direction (e.g., horizontal direction). Each of the first pixel circuit PXL1 and the second pixel circuit PXL2 includes a light emitting element EL, a driving transistor DT for driving the light emitting element EL, and an EM transistor Tem for switching a current path connected to the driving transistor DT.

The first pixel circuit PXL1 includes a first light emitting element EL1, a first driving transistor DT1, and a first EM transistor Tem1. The first EM transistor Tem1 is connected between a first power line and a first-a node N1a, the first driving transistor DT1 is connected between the first-a node N1a and a second-a node N2a, and the first light emitting element EL1 is connected between the second-a node N2a and a low-potential voltage line.

When a gate-on voltage of a first EM signal EM1 is applied, the first EM transistor Tem1 is turned on and supplies a pixel driving voltage EVDD to the first-a node N1a. The first EM transistor Tem1 includes a gate connected to a gate line to which the first EM signal EM1 is applied, a first electrode connected to the first power line to which the pixel driving voltage is supplied, and a second electrode connected to the first-a node N1a.

The first driving transistor DT1 drives the first light emitting element EL1 by supplying a current to the first light emitting element EL1 according to a gate-source voltage Vgs. The first driving transistor DT1 includes a gate to which a data voltage is applied, a first electrode connected to the first-a node N1a, and a second electrode connected to the second-a node N2a.

The second pixel circuit PXL2 includes a second light emitting element EL2, a second driving transistor DT2, and a second EM transistor Tem2. The second EM transistor Tem2 is connected between the first power line and a first-b node N1b, the second driving transistor DT2 is connected between the first-b node N1b and a second-b node N2b, and the second light emitting element EL2 is connected between the second-b node N2b and a second power line.

When a gate-on voltage of a second EM signal EM2 is applied, the second EM transistor Tem2 is turned on and supplies the pixel driving voltage EVDD to the first-b node N1b. The second EM transistor Tem2 includes a gate connected to the gate line to which the second EM signal EM2 is applied, a first electrode connected to the first power line to which the pixel driving voltage is supplied, and a second electrode connected to the first-b node N1b.

The second driving transistor DT2 drives the second light emitting element EL2 by supplying a current to the second light emitting element EL2 according to the gate-source voltage Vgs. The second driving transistor DT2 includes a gate to which the data voltage is applied, a first electrode connected to the first-b node N1b, and a second electrode connected to the second-b node N2b.

In this case, the first-a node N1a in the first pixel circuit PXL1 and the first-b node N1b in the second pixel circuit PXL2 are connected to each other. The first-a node N1a and the first-b node N1b are one first node N1 connected by a connection line. When the gate-on voltage of the first EM signal EM1 is applied to the first EM transistor Tem1, the first EM transistor Tem1 is turned on and supplies the pixel driving voltage to the first-a node N1a and the first-b node N1b. The first driving transistor DT1 connected to the first-a node N1a and the second driving transistor DT2 connected to the first-b node N1b supply a current to the first light emitting element EL1 and the second light emitting element EL2 according to the gate-source voltage and thereby drive the first light emitting element EL1 and the second light emitting element EL2.

In addition, when the gate-on voltage of the second EM signal EM2 is applied to the second EM transistor Tem2, the second EM transistor Tem2 is turned on and supplies the pixel driving voltage to the first-b node N1b and the first-a node N1a. The second driving transistor DT2 connected to the first-b node N1b and the first driving transistor DT1 connected to the first-a node N1a supply a current to the second light emitting element EL2 and the first light emitting element EL1 according to the gate-source voltage and thereby drive the second light emitting element EL2 and the first light emitting element EL1.

Figure 11:
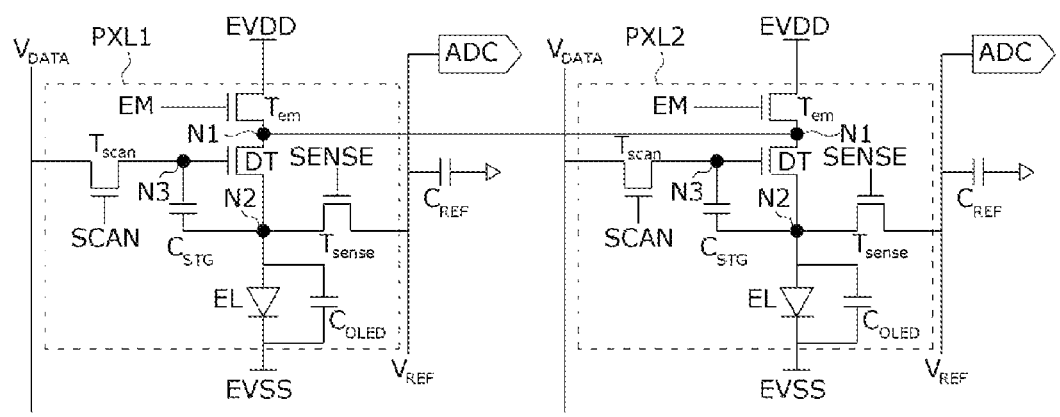
FIGS. 11 and 12 are circuit diagrams illustrating pixel circuits according to a sixth embodiment and a seventh embodiment of the present disclosure, respectively.
Figure 12:
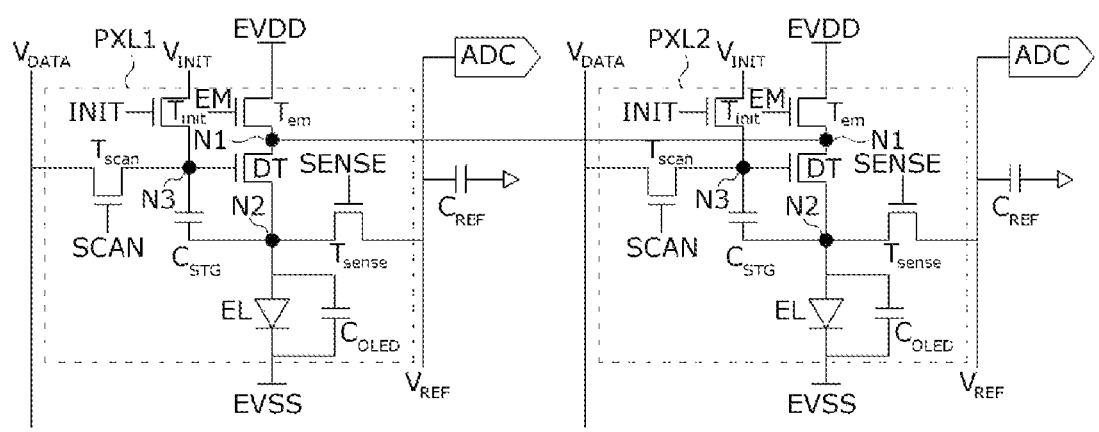

FIGS. 11 and 12 are circuit diagrams illustrating pixel circuits according to a sixth embodiment and a seventh embodiment of the present disclosure, respectively.

Referring to FIG. 11, the pixel circuit according to the sixth embodiment includes a first pixel circuit PLX1 and a second pixel circuit PLX2 arranged in a line direction. Each of the first pixel circuit PLX1 and the second pixel circuit PLX1 includes a light emitting element EL, a driving transistor DT for driving the light emitting element EL, an EM transistor Tem for switching a current path connected to the driving transistor DT, a sensing transistor Tsense, a scan transistor Tscan, and a capacitor $C_{STG}$ for storing a gate-source voltage Vgs of the driving transistor DT.

Referring to FIG. 12, the pixel circuit according to the seventh embodiment includes a first pixel circuit PLX1 and a second pixel circuit PLX2 arranged in a line direction. Each of the first pixel circuit PLX1 and the second pixel circuit PLX2 further includes an initialization transistor Tinit connected between an initialization voltage line and the third node. In this pixel circuit, the driving transistor DT, the EM transistor Tem, the sensing transistor Tsense, the scan transistor Tscan, and the initialization transistor Tinit may be implemented as n-channel oxide transistors.

The initialization transistor Tinit applies an initialization voltage $V_{INIT}$ in response to an initialization signal INIT. The initialization voltage $V_{INIT}$ is applied to the first node N1 through the initialization voltage line.

Figure 13A:
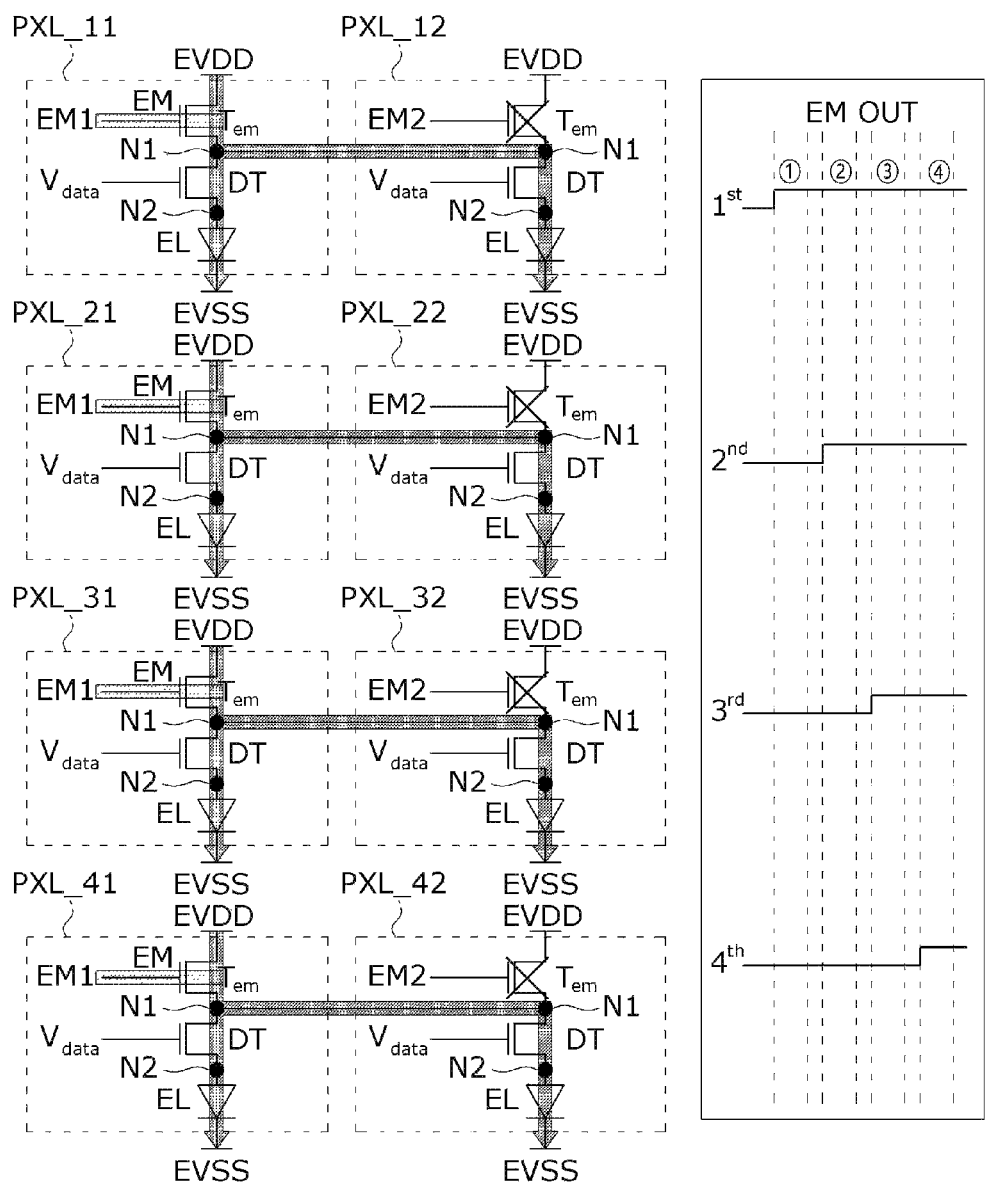
FIGS. 13A and 13B are diagrams illustrating an operation principle of the pixel circuit shown in FIG. 10 according to the fifth embodiment of the present disclosure.
Figure 13B:
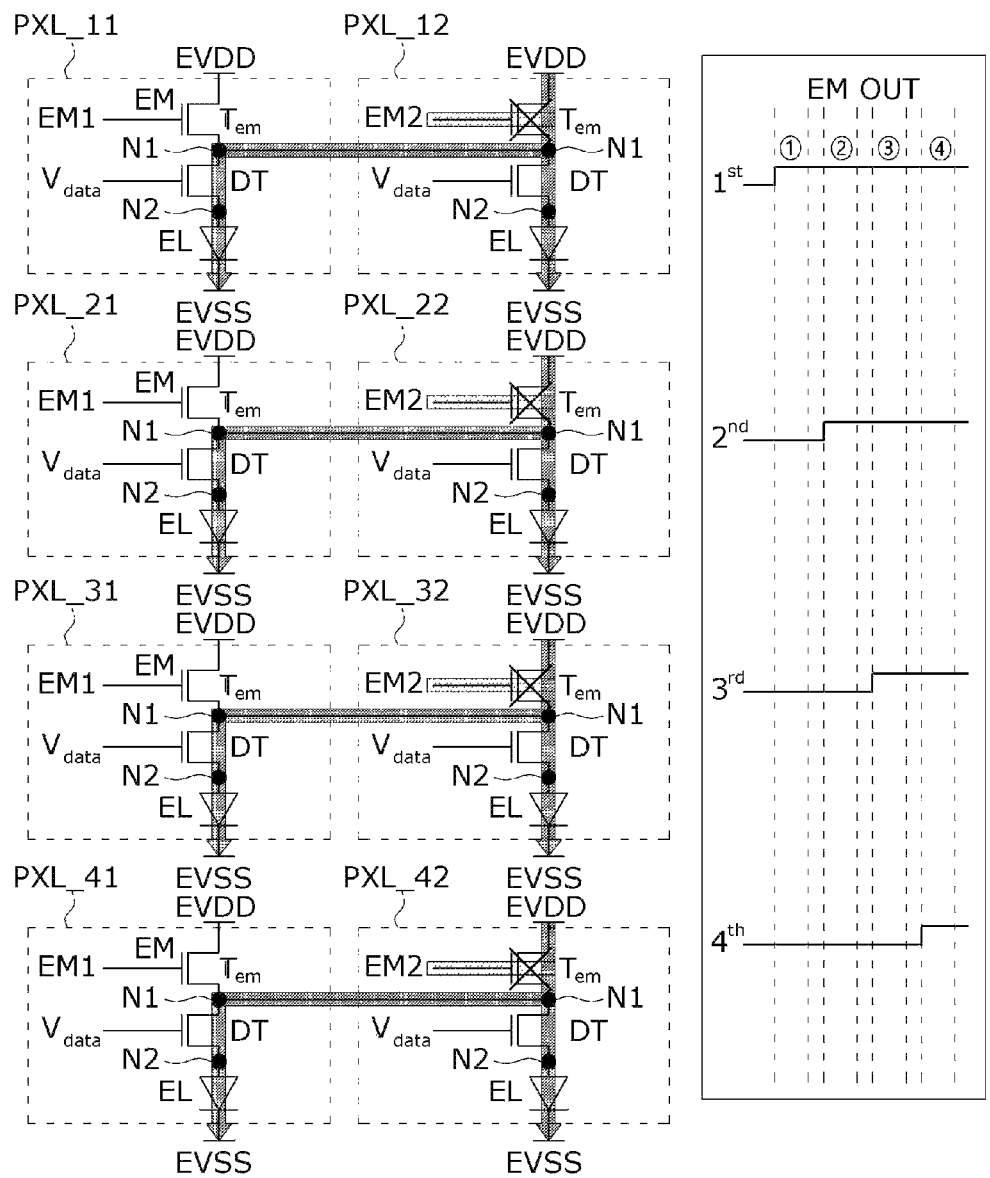

FIGS. 13A and 13B are diagrams illustrating an operation principle of the pixel circuit shown in FIG. 10 according to the fifth embodiment.

Referring to FIG. 13A, in the odd-numbered frame period, the gate-on voltage of the first EM signal EM1 is applied to the odd-numbered EM line, and the EM transistors Tem in the odd-numbered pixel circuits PXL_11, PXL_21, PXL_31, and PXL_41 of each pixel line connected to the odd-numbered EM line are turned on. When the EM transistors Tem in the odd-numbered pixel circuits PXL_11, PXL_21, PXL_31, and PXL_41 are turned on, a pixel driving voltage is applied, and all of the light emitting elements EL of the odd-numbered pixel circuits PXL_11, PXL_21, PXL_31, and PXL_41 and the even-numbered pixel circuits PXL_12, PXL_22, PXL_32, and PXL_42 are driven.

At this time, the gate-off voltage is applied to the EM transistors in the even-numbered pixel circuits, which are thereby turned off.

Referring to FIG. 13B, in the even-numbered frame period, the gate-on voltage of the second EM signal EM2 is applied to the even-numbered EM line, and the EM transistors Tem in the even-numbered pixel circuits PXL_12, PXL_22, PXL_32, and PXL_42 of each pixel line connected to the even-numbered EM line are turned on. When the EM transistors Tem in the even-numbered pixel circuits PXL_12, PXL_22, PXL_32, and PXL_42 are turned on, a pixel driving voltage is applied, and all of the light emitting elements EL of the even-numbered pixel circuits PXL_12, PXL_22, PXL_32, and PXL_42 and the odd-numbered pixel circuits PXL_11, PXL_21, PXL_31, and PXL_41 are driven.

At this time, the gate-off voltage is applied to the EM transistors in the odd-numbered pixel circuits, which are thereby turned off.

In a state where the light emitting element is driven at a 100% duty ratio, the EM transistor is driven at a 50% duty ratio. In this case, the EM transistors share the EM signal in units of 2 horizontal periods (2H).

Figure 14:
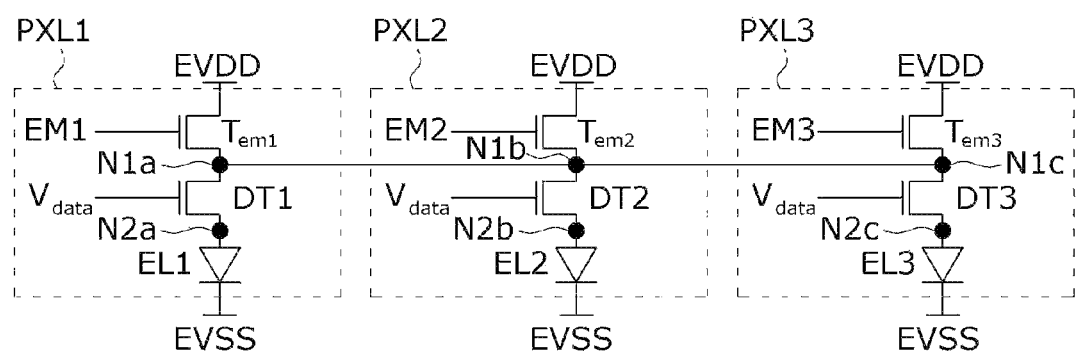
FIG. 14 is a diagram illustrating a pixel circuit according to an eighth embodiment of the present disclosure.

FIG. 14 is a diagram illustrating a pixel circuit according to an eighth embodiment of the present disclosure.

Referring to FIG. 14, the pixel circuit according to the eighth embodiment includes a first pixel circuit PXL1, a second pixel circuit PXL2, and a third pixel circuit PXL3 arranged in a line direction (e.g., horizontal direction). Each of the first pixel circuit PXL1, the second pixel circuit PXL2, and a third pixel circuit PXL3 includes a light emitting element EL1, EL2, or EL3, a driving transistor DT1, DT2, or DT3 for driving the light emitting element EL1, EL2, or EL3, and an EM transistor Tem1, Tem2, or Tem3 for switching a current path connected to the driving transistor DT1, DT2, or DT3.

In this case, a first-a node N1a in the first pixel circuit PXL1, a first-b node N1b in the second pixel circuit PXL2, and a first-c node N1c in the third pixel circuit PXL3 are connected to each other. The first-a node N1a, the first-b node N1b, and the first-c node N1c are one first node N1 connected by a connection line. When a gate-on voltage of an EM signal is applied to the EM transistor Tem in the first pixel circuit PXL1, the EM transistor Tem in the second pixel circuit PXL2, or the EM transistor Tem in the third pixel circuit PXL3, it is turned on and supplies the pixel driving voltage EVDD to the first node N1 of the first, second, and third pixel circuits PXL1, PXL2, and PXL3. The driving transistor DT1 connected to the first-a node N1a in the first pixel circuit PXL1, the driving transistor DT2 connected to the first-b node N1b in the second pixel circuit PXL2, and the driving transistor DT3 connected to the first-c node N1c in the third pixel circuit PXL3 supply a current to the first, second, and third light emitting elements EL1, EL2, and EL3 according to the gate-source voltage and thereby drive the first, second, and third light emitting elements EL1, EL2, and EL3.

In a state where the light emitting element is driven at a 100% duty ratio, the EM transistor is driven at an approximately 33% duty ratio. In this case, the EM transistors share the EM signal in units of 3 horizontal periods (3H).

Figure 15:
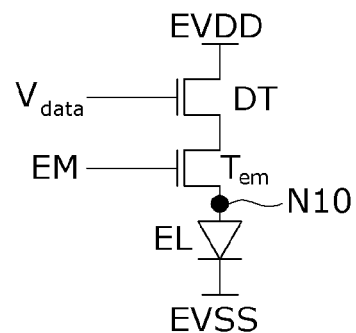
FIGS. 15 and 16 are diagrams illustrating various pixel circuits applicable to the pixel circuit of the present disclosure.
Figure 16:
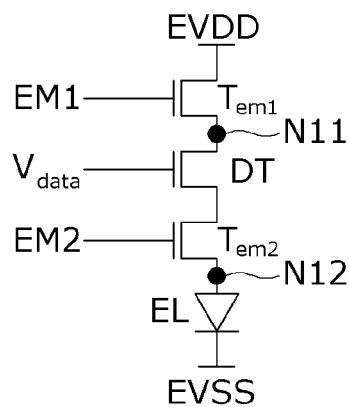

FIGS. 15 and 16 are diagrams illustrating various pixel circuits applicable to the pixel circuit of the present disclosure.

Referring to FIG. 15, the pixel circuit includes a light emitting element EL, a driving transistor DT for driving the light emitting element EL, and an EM transistor Tem for switching a current path connected to the driving transistor DT.

The EM transistor Tem is connected between the driving transistor DT and the light emitting element EL, and is connected to the light emitting element EL through an EM sharing node N10. The EM transistor Tem is connected to all light emitting elements in at least one other pixel circuit through the EM sharing node N10.

Referring to FIG. 16, the pixel circuit includes a light emitting element EL, a driving transistor DT for driving the light emitting element EL, and a first EM transistor Tem1 and second EM transistor Tem2 for switching current paths connected to the driving transistor DT.

The first EM transistor Tem1 is connected between the driving transistor DT and a first power line to which a pixel driving voltage EVDD is applied, and is connected to the driving transistor DT through a first EM sharing node N11. The first EM transistor Tem1 is connected to all driving transistors in at least one other pixel circuit through the first EM sharing node N11.

The second EM transistor Tem2 is connected between the driving transistor DT and the light emitting element EL, and is connected to the light emitting element EL through a second EM sharing node N12. The second EM transistor Tem2 is connected to all light emitting elements in at least one other pixel circuit through the second EM sharing node N12.

Embodiments may be implemented using, but not limited to, various pixel circuits as described above, and any type of pixel circuit capable of sharing an EM signal may be applied.

Hereinafter, a display device including a display panel to which a pixel circuit according to an embodiment is applied will be described.

Figure 17:
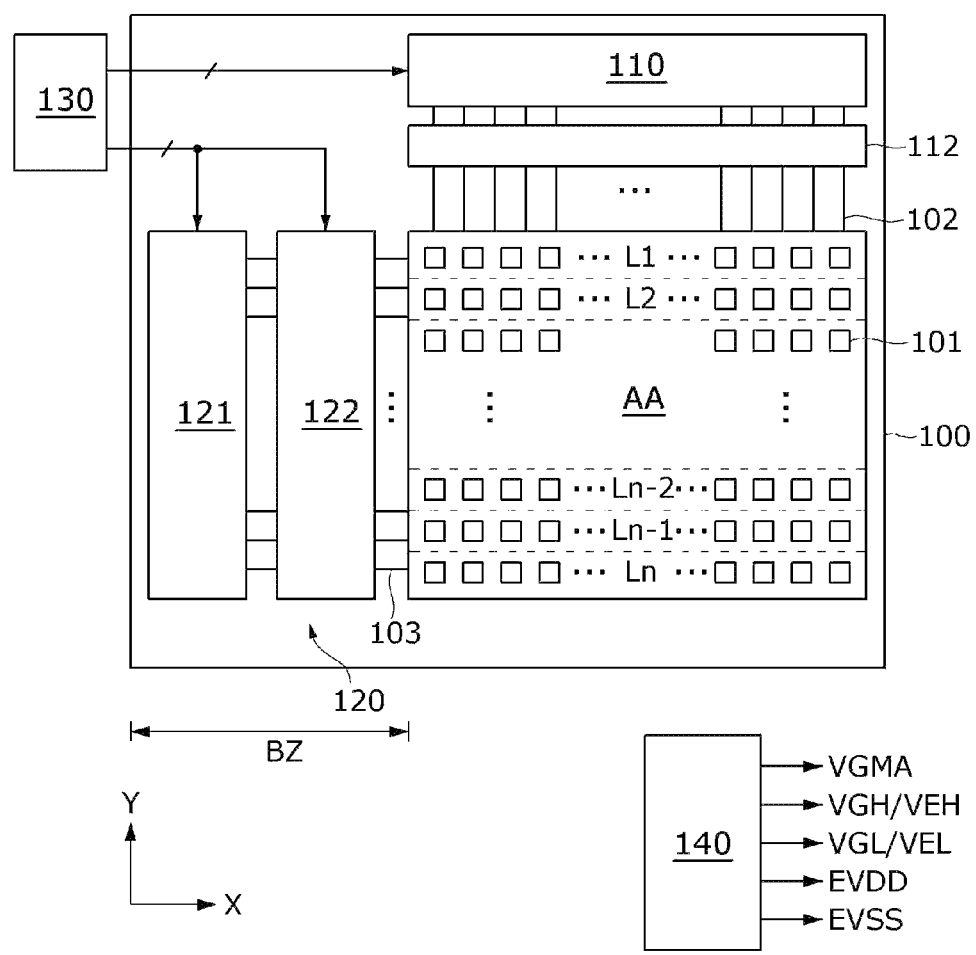
FIG. 17 is a block diagram illustrating a display device according to an embodiment of the present disclosure.

FIG. 17 is a block diagram illustrating a display device according to an embodiment of the present disclosure.

Referring to FIG. 17, the display device according to an embodiment of the present disclosure includes a display panel 100, a display panel driving circuit for writing pixel data to pixels of the display panel 100, and a power supply 140 for generating power necessary for driving the pixels and the display panel driving circuit.

The display panel 100 includes a pixel array AA that displays an input image. The pixel array AA includes a plurality of data lines 102, a plurality of gate lines 103 that intersect with the plurality of data lines 102, and pixels arranged in a matrix form.

The pixel array AA includes a plurality of pixel lines L1 to Ln. Each of the pixel lines L1 to Ln includes one line of pixels arranged along a line direction X in the pixel array AA of the display panel 100. Pixels arranged in one pixel line share a gate line 103. Sub-pixels arranged in a column direction Y along a data line direction share the same data line 102. One horizontal period 1H is a time obtained by dividing one frame period by the total number of pixel lines L1 to Ln.

Pixels are connected to each other at least every two pixels in a column direction or a line direction. In this case, source nodes of EM transistors in a plurality of pixels are connected and share an EM signal.

Touch sensors may be disposed on the display panel 100. A touch input may be sensed using separate touch sensors or may be sensed through pixels. The touch sensors may be disposed as an on-cell type or an add-on type on the screen of the display panel or implemented as in-cell type touch sensors embedded in the pixel array AA.

The display panel 100 may be implemented as a flexible display panel. The flexible display panel may be made of a plastic OLED panel. An organic thin film may be disposed on a back plate of the plastic OLED panel, and the pixel array AA may be formed on the organic thin film.

The back plate of the plastic OLED may be a polyethylene terephthalate (PET) substrate. The organic thin film is formed on the back plate. The pixel array AA and a touch sensor array may be formed on the organic thin film. The back plate blocks moisture permeation so that the pixel array AA is not exposed to humidity. The organic thin film may be a thin Polyimide (PI) film substrate. A multi-layered buffer film may be formed of an insulating material (not shown) on the organic thin film. Lines may be formed on the organic thin film so as to supply power or signals applied to the pixel array AA and the touch sensor array.

To implement color, each of the pixels may be divided into a red sub-pixel (hereinafter referred to as "R sub-pixel"), a green sub-pixel (hereinafter referred to as "G sub-pixel"), and a blue sub-pixel (hereinafter referred to as "B sub-pixel"). Each of the pixels may further include a white sub-pixel. Each of the sub-pixels 101 includes a pixel circuit. The pixel circuit is connected to the data line 102 and the gate line 103.

Hereinafter, a pixel may be interpreted as having the same meaning as a sub-pixel.

The power supply 140 generates direct current (DC) power required for driving the pixel array AA and the display panel driving circuit of the display panel 100 by using a DC-DC converter. The DC-DC converter may include a charge pump, a regulator, a buck converter, a boost converter, and the like. The power supply 140 may adjust a DC input voltage from a host system (not shown) and thereby generate DC voltages such as a gamma reference voltage VGMA, gate-on voltages VGH and VEH, gate-off voltages VGL and VEL, a pixel driving voltage EVDD, and a pixel low-potential power supply voltage EVSS. The gamma reference voltage VGMA is supplied to a data driver 110. The gate-on voltages VGH and VEH and the gate-off voltages VGL and VEL are supplied to a gate driver 120. The pixel driving voltage EVDD and the pixel low-potential power supply voltage EVSS are commonly supplied to the pixels.

The display panel driving circuit writes pixel data (digital data) of an input image to the pixels of the display panel 100 under the control of a timing controller (TCON) 130.

The display panel driving circuit includes the data driver 110 and the gate driver 120.

A de-multiplexer (DEMUX) 112 may be disposed between the data driver 110 and the plurality of data lines 102. The de-multiplexer 112 sequentially connects one channel of the data driver 110 to the plurality of data lines 102 and distributes in a time division manner the data voltage outputted from one channel of the data driver 110 to the data lines 102, thereby reducing the number of channels of the data driver 110. The de-multiplexer array 112 may be omitted. In this case, output buffers AMP of the data driver 110 are directly connected to the data lines 102.

The display panel driving circuit may further include a touch sensor driver for driving the touch sensors. The touch sensor driver is omitted from FIG. 1. In a mobile device, the timing controller 130, the power supply 140, the data driver 110, and the like may be integrated into one drive integrated circuit (IC).

The data driver 110 generates a data voltage Vdata by converting pixel data of an input image received from the timing controller 130 with a gamma compensation voltage every frame period by using a digital to analog converter (DAC). The gamma reference voltage VGMA is divided for respective gray scales through a voltage divider circuit. The gamma compensation voltage divided from the gamma reference voltage VGMA is provided to the DAC of the data driver 110. The data voltage Vdata is outputted through the output buffer AMP in each of the channels of the data driver 110.

In the data driver 110, the output buffer AMP included in one channel may be connected to adjacent data lines 102 through the de-multiplexer array 112. The de-multiplexer array 112 may be formed directly on the substrate of the display panel 100 or integrated into one drive IC together with the data driver 110.

The gate driver 120 may be implemented as a gate in panel (GIP) circuit formed directly on a bezel BZ area of the display panel 100 together with the TFT array of the pixel array AA. The gate driver 120 sequentially outputs gate signals to the gate lines 103 under the control of the timing controller 130. The gate driver 120 may sequentially supply the gate signals to the gate lines 103 by shifting the gate signals using a shift register.

The gate signal may include a scan signal for selecting pixels of a line in which data is to be written in synchronization with the data voltage, and an EM signal defining an emission time of pixels charged with the data voltage.

The gate driver 120 may include a scan driver 121 and an EM driver 122.

The scan driver 121 outputs a scan signal SCAN in response to a start pulse and a shift clock from the timing controller 130, and shifts the scan signal SCAN according to the shift clock timing. The EM driver 122 outputs an EM signal EM in response to a start pulse and a shift clock from the timing controller 130, and sequentially shifts the EM signal EM according to the shift clock. Therefore, the scan signal SCAN, and the EM signal EM are sequentially supplied to the gate lines 103 of the pixel lines L1 to Ln. In case of a bezel-free model, at least some of transistors constituting the gate driver 120 and clock wirings may be dispersedly disposed in the pixel array AA.

The timing controller 130 receives, from a host system (not shown), digital video data DATA of an input image and a timing signal synchronized therewith. The timing signal includes a vertical synchronization signal Vsync, a horizontal synchronization signal Hsync, a main clock CLK, a data enable signal DE, and the like. Because a vertical period and a horizontal period can be known by counting the data enable signal DE, the vertical synchronization signal Vsync and the horizontal synchronization signal Hsync may be omitted. The data enable signal DE has a cycle of one horizontal period (1H).

The host system may be any one of a television (TV) system, a set-top box, a navigation system, a personal computer (PC), a home theater system, a vehicle system, and a mobile device system.

The timing controller 130 multiplies an input frame frequency by i and controls the operation timing of the display panel driving circuit with a frame frequency of the input frame frequency×i (i is a positive integer greater than 0) Hz. The input frame frequency is 60 Hz in the NTSC (National Television Standards Committee) scheme and 50 Hz in the PAL (phase-alternating line) scheme.

Based on the timing signals Vsync, Hsync, and DE received from the host system, the timing controller 130 generates a data timing control signal for controlling the operation timing of the data driver 110, MUX signals MUX1 and MUX2 for controlling the operation timing of the de-multiplexer array 112, and a gate timing control signal for controlling the operation timing of the gate driver 120.

Although the embodiments of the present disclosure have been described in more detail with reference to the accompanying drawings, the present disclosure is not limited thereto and may be embodied in many different forms without departing from the technical concept of the present disclosure. Therefore, the embodiments disclosed in the present disclosure are provided for illustrative purposes only and are not intended to limit the technical concept of the present disclosure. The scope of the technical concept of the present disclosure is not limited thereto. Therefore, it should be understood that the above-described embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A pixel circuit comprising:
   a first pixel circuit including a first EM transistor to which a pulse of a first EM signal is applied, and a first driving transistor configured to drive a first light emitting element; and
   a second pixel circuit including a second EM transistor to which a pulse of a second EM signal is applied, and a second driving transistor configured to drive a second light emitting element,
   wherein a node between the first EM transistor and the first driving transistor and a node between the second EM transistor and the second driving transistor are connected,
   wherein the first EM transistor is connected between a first power line and the first driving transistor, and responsive to the first EM transistor being turned on, a pixel driving voltage of first power line is supplied to the first driving transistor such that the first driving transistor drives the first light emitting element to emit light,
   wherein the second EM transistor is connected between a second power line and the second driving transistor, and responsive to the second EM transistor being turned on, a pixel driving voltage of second power line is supplied to the second driving transistor such that the second driving transistor drives the second light emitting element to emit light, and
   wherein the first pixel circuit and the second pixel circuit share a same data line with each other.

2. The pixel circuit of claim 1, wherein the first pixel circuit and the second pixel circuit share a same scan line with each other, and EM lines of the first pixel circuit and the second pixel circuit are different from each other.

3. The pixel circuit of claim 1, wherein a light emission duty ratio that the first light emitting element and the second light emitting element emit light during one frame period is greater than a duty ratio of the first EM signal and the second EM signal respectively applied to a gate electrode of the first EM transistor and a gate electrode of the second EM transistor, and
   wherein the duty ratio of the first EM signal is a value based on a light emission duty ratio and a number of pixel circuits connected.

4. The pixel circuit of claim 1, wherein the second pixel circuit includes at least one pixel circuit, and
   the first pixel circuit and the at least one pixel circuit receive a pulse of the first EM signal in different frame periods.

5. The pixel circuit of claim 1, wherein the first pixel circuit further includes:
   a first scan transistor connected between a data line and a gate electrode of the first driving transistor;
   a first sensing transistor connected between a source electrode of the first driving transistor and a reference voltage line; and
   a first capacitor connected between the gate electrode and the source electrode of the first driving transistor.

6. The pixel circuit of claim 1, wherein the second pixel circuit further includes:
   a second scan transistor connected between a data line and a gate electrode of the second driving transistor;
   a second sensing transistor connected between a source electrode of the second driving transistor and a reference voltage line; and a second capacitor connected between the gate electrode and the source electrode of the second driving transistor.

7. A display panel comprising:
a plurality of pixels each including a light emitting element that emits light by a current flowing through a current path formed between a high-potential voltage line and a low-potential voltage line, and
the pixel circuit of claim 1 configured to drive light emitting elements of the plurality of pixels,
wherein the current path is connected between at least two pixel circuits.

8. The display panel of claim 7, wherein a light emission duty ratio that the light emitting element emits light during one frame period is greater than a duty ratio of the first EM signal applied to a gate electrode of the first EM transistor.

9. The display panel of claim 8, wherein the duty ratio of the first EM signal is a value based on a light emission duty ratio and a number of pixel circuits connected.

10. The display panel of claim 7, wherein the at least two pixel circuits receive a pulse of the first EM signal in different frame periods.

11. The display panel of claim 7, wherein each of the at least two pixel circuits further includes:
a driving transistor supplying a current through the current path;
a scan transistor connected between a data line and a gate electrode of the driving transistor;
a sensing transistor connected between a source electrode of the driving transistor and a reference voltage line; and
a capacitor connected between the gate electrode and the source electrode.

12. The display panel of claim 7, wherein the at least two pixel circuits share a same scan line with each other, and EM lines of the at least two pixel circuits are different from each other.

13. The display panel of claim 7, wherein all transistors in a panel including the pixel circuits are implemented with oxide thin film transistors (TFTs) including an n-channel type oxide semiconductor.

* * * * *